US008816326B2

(12) United States Patent
Yin et al.

(10) Patent No.: US 8,816,326 B2
(45) Date of Patent: Aug. 26, 2014

(54) SEMICONDUCTOR DEVICE AND MANUFACTURING METHOD THEREOF

(75) Inventors: Huaxiang Yin, Beijing (CN); Jun Luo, Beijing (CN); Chao Zhao, Kessel-lo (BE); Honggang Liu, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 267 days.

(21) Appl. No.: 13/497,249

(22) PCT Filed: Nov. 25, 2011

(86) PCT No.: PCT/CN2011/001965
§ 371 (c)(1),
(2), (4) Date: Mar. 20, 2012

(87) PCT Pub. No.: WO2013/063726
PCT Pub. Date: May 10, 2013

(65) Prior Publication Data
US 2013/0105763 A1 May 2, 2013

(30) Foreign Application Priority Data
Nov. 1, 2011 (CN) .......................... 2011 1 0339415

(51) Int. Cl.
*H01L 29/78* (2006.01)
*H01L 29/66* (2006.01)
*H01L 29/778* (2006.01)
*H01L 29/08* (2006.01)

(52) U.S. Cl.
CPC ...... *H01L 29/66462* (2013.01); *H01L 29/7785* (2013.01); *H01L 29/0895* (2013.01); *Y10S 977/938* (2013.01)
USPC .............. 257/24; 257/E21.409; 257/E29.255; 977/938; 438/197

(58) Field of Classification Search
USPC ....................................... 257/24, 76
See application file for complete search history.

(56) References Cited

U.S. PATENT DOCUMENTS

| 5,811,844 | A | 9/1998 | Kuo et al. ...................... 247/194 |
| 6,091,076 | A * | 7/2000 | Deleonibus ..................... 257/24 |
| 6,472,685 | B2 | 10/2002 | Takagi .............................. 257/77 |
| 7,566,922 | B2 | 7/2009 | Deleonibus ................... 257/200 |
| 7,839,209 | B2 | 11/2010 | Curatola et al. .............. 327/566 |
| 2002/0011628 | A1 | 1/2002 | Takagi ........................... 257/368 |
| 2007/0187728 | A1 | 8/2007 | Deleonibus ................... 257/288 |
| 2010/0015802 | A1 * | 1/2010 | Snyder et al. ................. 438/664 |
| 2010/0097135 | A1 | 4/2010 | Curatola et al. .............. 327/581 |
| 2011/0147708 | A1 * | 6/2011 | Radosavljevic et al. ......... 257/24 |
| 2011/0260173 | A1 | 10/2011 | Wang et al. ...................... 257/76 |

FOREIGN PATENT DOCUMENTS

| CN | 1218994 | A | 6/1999 | .............. H01L 29/10 |
| CN | 101523607 | A | 2/2009 | .............. H01L 29/739 |
| CN | 1218994 | A | 6/2009 | .............. H01L 29/10 |
| CN | 101819996 | A | 1/2010 | .............. H01L 29/78 |
| TW | 201041136 | A1 | 11/2010 | .............. H01L 29/40 |

* cited by examiner

*Primary Examiner* — David Vu
*Assistant Examiner* — Jonathan Han
(74) *Attorney, Agent, or Firm* — Martine Penilla Group, LLP

(57) ABSTRACT

A semiconductor device, which comprises: a semiconductor substrate; a channel region on the semiconductor substrate, said channel region including a quantum well structure; a source region and a drain region on the sides of the channel region; a gate structure on the channel region; wherein the materials for the channel region, the source region and the drain region have different energy bands, and a tunneling barrier structure exists between the source region and the channel region.

21 Claims, 4 Drawing Sheets

SEMICONDUCTOR DEVICE AND MANUFACTURING METHOD THEREOF

CLAIM OF PRIORITY

This application is a section 371 National Stage Application of International Application No. PCT/CN2011/001965, filed on Nov. 25, 2011, which claims priority to Chinese Application No. CN201110339415.8, filed on Nov. 1, 2011 entitled "Semiconductor Device and Manufacturing Method Thereof", the entire contents of which are incorporated herein by reference in their entirety.

FIELD OF THE INVENTION

The present invention relates to a semiconductor device and the manufacturing method thereof.

BACKGROUND OF THE INVENTION

In the past few decades, the technique of scaling down MOS devices has greatly improved the performance and speed of CMOS integrated circuits. The law of the number of transistors per unit area on a chip being doubled every 18 months as described by the Moore's Law is still true today. With the increasing development in the integrated circuit technique, during the continuous scaling down of the CMOS technique, the power consumption and working voltage of MOS devices thereof cannot keep scaling down at the same scale, and various parasitic effects, performance deterioration and reliability issues are becoming more and more serious. Especially when the channel is reduced to a nanometer range, the bulk silicon MOS device is close to its physical limit, thus many serious problems like short channel effect, low mobility and reduced gate dielectric thickness occur. Therefore, with the reduction in channel size, one of the challenges faced by the conventional bulk silicon CMOS technique is to maintain a high drive current with a reasonable drain current while controlling the short channel effect of the device. However, at the present technological level, the thickness of nitrogen oxide, polysilicon and gate-oxide, for example, has already reached the limit of scaling down, and due to dielectric current leakage, device power consumption and the tunneling effect of thin layer gate oxide, further reduction in size is greatly restricted and cannot promote a continuous improvement of the device performance. Based on the above-described background, it is important for the development of the integrated circuit technique to develop a new device structure that can suppress the short channel effect during the size reduction process, increase the driving capability of the channel and increase integration so as to breakthrough the channel size reduction limitation.

Another method of overcoming the limitation of the Moore's Law is to integrate devices and circuits of different functions, for example, MPU, image processing, memory (SRAM, flash memory, DRAM), logic processor, DSP, signal mixer, radio frequency (RF) and peripheral function components, thereby realizing the advantages obtained through system integration, such as high performance, low price, small contact area and volume, excellent power management. Such kind of integration technique is called System in a Package (SIP). System in a Package can enclose all or most of the electronic functions, which may be a system or subsystem, or components, circuits and elements, into one package body, besides, the System in a Package is not only a package of a single chip or multiple chips, but it may also include such passive devices as capacitors and resistors. For example, the System in a Package at present can integrate microprocessors, memories (e.g. Flash, SRAM and DRAM), sensors, resistors, capacitors and inductors into one package that accommodate a plurality of chips. But the SIP structure is facing a serious problem in heat dissipating for the following reasons: 1) the stacked chips will generate more heat, but the area of dissipation is not accordingly increased, which results in a great increase in the density of heat generation; 2) the multiple-chip package has the original area of dissipation retained, but the heat sources abut against each other and the heat coupling is enhanced, which results in more serious heat problems; 3) the passive devices built in the substrate also have certain heat problems, meanwhile, the organic or ceramic substrate has poor heat dispersion, which also results in serious heat dissipation problems; 4) the volume of the package is reducing, and the assembling density is increasing, which made the heat dissipation problem even worse, so a highly efficient heat dissipation design is needed.

In fact, the power consumption problem has always been a very important problem in the design and manufacturing of integrated circuits and MOS devices. From the early bipolar transistor circuits to the nanometer CMOS integrated circuits nowadays, power reduction has always been one of the main reasons for the changes and development to the fundamental devices and integrated circuits. Ever since the process node of the CMOS technique enters 90 nm, the drain current problem in the sub-threshold region of the MOS transistor becomes increasingly serious, the static power consumption of the CMOS circuit increases greatly, and power management becomes an important factor of consideration. When the process node is further reduced, namely, when it enters 45 nm, the gate oxide is getting thinner, the gate drain current increases, the device current leakage becomes more serious, and accordingly, the power consumption increases rapidly. At present, high performance microprocessors and computer systems are facing serious system power consumption problems which are mainly caused by the increase in the current leakage of large-scale integrated devices, the non-proportional reduction in the working voltage due to limitation by the device principle, linear increase in the number of transistors, and the corresponding power consumption of multi-functional system integration.

The main functions of an integrated circuit include the two categories of logic and storage. The logic circuits are usually built according to the Von Neumann architecture to realize the functions of controlling and changing the status, such as logic switching and computing. A logic circuit is formed by a great number of repeated MOS transistors, wherein the transistors are usually switching devices, one transistor forming one logic switch. A memory is formed by a great number of MOS transistors having storage function and/or other functional devices to store and temporarily store information. Dynamic Random Access Memory (DRAM) is an important type of memory and it usually consists of a switching transistor for controlling access of information and a capacitor for storing electric charge information, which form an information storage unit and consumes power.

To overcome the above-mentioned problems with power consumption occurred in the process of integrated circuit development, there are the following courses of action to take: (1) reducing the device working voltage, from example, from 1 volt to 0.5 volt; (2) reducing the device drain current; (3) merging the functions of the devices to reduce the total number of transistors and increasing the energy utilization efficiency of a single-transistor.

A device employing a new principle to reduce working voltage has been developed at present, namely, a tunneling transistor (TFET). The tunneling transistor makes use of the quantum tunneling mechanism and breaks the limit of thermokinetics with the sub-threshold factor ss smaller than 60 mV/dec, so the sub-threshold transition area is reduced, which results in a smaller device working voltage and a general reduction in power consumption.

Many kinds of tunneling transistor structures have been developed currently, as shown in FIG. 1. FIG. 1a shows a silicon-based homogeneous p-i-n tunneling structure, which has such characteristics as low tunneling efficiency and small drive current. The SS thereof is about 40 mV/dec and the working voltage is about 0.7V. FIG. 1b shows a silicon based heterojunction p-i-n tunneling structure, which has improved tunneling efficiency and increased drive current. The SS thereof is about 40 mV/dec and the working voltage is about 0.5V. FIG. 1c shows a narrow band homogeneous p-i-n tunneling structure, which has improved tunneling efficiency and increased drive current, with SS<<40 mV/dec and the working voltage of about 0.4V. And its reverse current leakage is large. FIG. 1d shows a silicon based homogeneous p-i-n tunneling structure with multiple gates, which has improved tunneling efficiency and increased drive current, the SS thereof is about 40 mV/dec and the working voltage is about 0.5V, and the reverse current leakage is reduced.

It can be seen that it would be significant to develop a new transistor structure that is greatly improved in working voltage, sub-threshold factor, drive current and/or reverse current leakage and so on, with respect to the present transistors (including tunneling transistors), in order to reduce power consumption of future integrated circuits.

The present invention reduces the total power consumption of the device, and even the circuit, based on the structure improvement and function merging of the tunneling transistor.

SUMMARY OF THE INVENTION

The present invention aims at solving one or more of the above-mentioned problems.

According to one aspect of the present invention, a semiconductor device is provided, comprising:
a semiconductor substrate;
a channel region on the semiconductor substrate, said channel region including a quantum well structure;
a source region and a drain region on the sides of the channel region;
a gate structure on the channel region;
wherein the materials for the channel region, the source region and the drain region have a energy band different from each other.

Wherein, a tunneling barrier structure exists between the source region and the channel region.

Wherein, electric charges tunnel from the source region into the channel region through the bather and are conducted to the drain region with high speed by means of the quantum well structure in the channel region so as to form electric current.

Wherein, the semiconductor device is used as a logic switch, and the information storage function of a single-transistor is realized through modulation of the tunneling barrier and the quantum well structure.

Wherein, the bandgap of the material of the source region is smaller than the bandgap of the material of the channel region, and the bandgap of the material of the channel region is smaller than the bandgap of the material of the drain region.

Wherein, the material of the drain region is Si, strained Si, Ge, strained Ge, GeSi, GaAs, InP, InGaAs, AlGaAs, InAlAs, InAs, AlSb, InSb, AlInSb, GaN or AlGaN.

Wherein, the quantum well structure in the channel region comprises strained Si/GeSi, Ge/GeSi, strained Ge/III-V compound semiconductor materials, GaN/AlGaN, InGaAs/InAlAs, InGaAs/AlGaAs, InAs/AlSb, InSb/AlInSb, or InGaAs/InP.

Wherein, the material of the source region is Si, strained Si, Ge, strained Ge, GeSi, GaAs, InP, InGaAs, AlGaAs, InAlAs, InAs, AlSb, InSb, AlInSb, GaN or AlGaN.

Wherein the tunneling barrier structure is a structure of highly doped (1e20 cm-3) PN junction, NP junction, PNP junction or NPN junction, or a structure of heavily doped heterogeneous energy band PN junction, NP junction, PNP junction or NPN junction, or a quantum well structure.

Wherein the substrate is an insulator, a semi-insulator or a semiconductor.

Wherein the gate structure is a single gate structure, a double-gate structure or a multiple-gate structure.

Wherein, the semiconductor device is a planar device or a vertical device.

According to another aspect of the present invention, a semiconductor device manufacturing method is provided, comprising:
providing a semiconductor substrate;
forming a semiconductor layer comprising a quantum well structure on the semiconductor substrate;
forming a first mask layer on the semiconductor layer;
patterning the mask layer to expose a drain formation region;
removing the semiconductor layer in the drain formation region;
forming a semiconductor material for a drain region;
forming a second mask layer and patterning the second mask layer to expose a source formation region;
removing the semiconductor layer in the source formation region;
forming a tunneling barrier structure on the sidewall of the exposed semiconductor layer;
forming a semiconductor material for a source region,
wherein the semiconductor layer between the source region and the drain region forms a channel region.

Wherein the materials of the channel region, the source region and the drain region have different energy bands.

The present invention provides a tunneling transistor structure and method that realize the logic and memory functions by heterogeneously integrating various semiconductor materials into one transistor, wherein the source region, drain region and channel region in the tunneling transistor are formed of three kinds of materials having different energy bands; the channel region is a multi-layered quantum well structure; a tunneling quantum barrier structure is provided between the source region and the channel region; the transistor conducts substantially by the electric charges tunneling from the source region to the channel region and passing through the high mobility quantum well channel; and information storage function of a single-transistor is realized through voltage modulating the electric charge distribution of the channel quantum well or through modulating the quantum barrier between the source region and the channel region.

The semiconductor device according to the present invention has the following advantages: (1) the tunneling transistor having ultralow working voltage (<0.5V); (2) extra-small SS<40 mV/dec; (3) the drive current of the tunneling transistor exceeding that of a common MOSFET; (4) preventing reverse current leakage of the tunneling transistor; (5) merging of the logic and memory functions in a single-transistor.

DETAILED DESCRIPTION OF THE PREFERRED EMBODIMENTS

One or more aspects of the embodiment of the present invention will be described below with reference to the figures, wherein throughout the figures, the same elements are usually represented by the same reference signs. In the descriptions below, many specific details are elucidated for the purpose of explanation, so that a thorough understanding of one or more aspects of the embodiment of the present invention can be provided. However, it is obvious to those skilled in the art that one or more aspects of the embodiment of the present invention may be implemented by a lower degree of said specific details.

In addition, although specific features or aspects of the embodiment are disclosed with respect to only one preferred embodiment among some preferred embodiments, such features or aspects can be combined with one or more other features or aspects of other preferred embodiments that might be desirable for and advantageous to any given or specific application.

Figure 10:
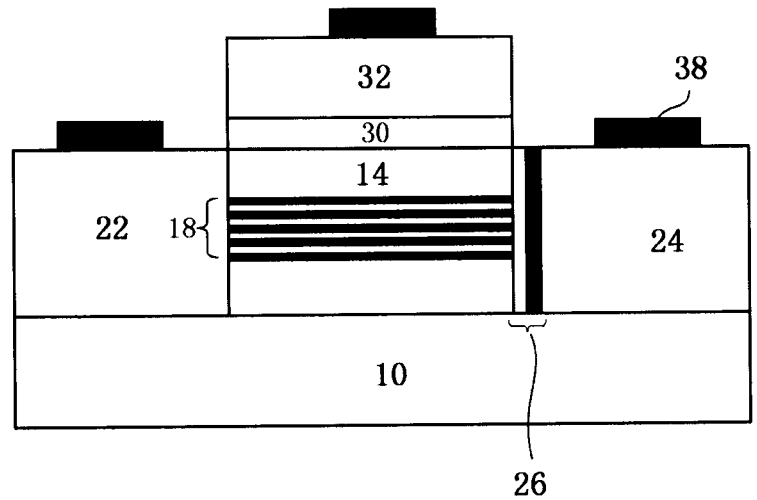
FIG. 10 shows the semiconductor device manufactured according to the embodiment of the present invention.

First, reference is made to FIG. 10, which shows a semiconductor device according to an embodiment of the present invention. A channel region 14 is formed on the surface of the semiconductor substrate 10, which comprises a quantum well structure 18, for example, a multi-layered quantum well structure formed of III-V compound semiconductors. The multi-layered quantum well structure formed of III-V compound semiconductors may, for example, include an alternating structure of a III-V compound semiconductor channel layer having a first bandgap and a III-V compound semiconductor barrier layer having a second bandgap.

The semiconductor substrate 10 used in the present invention may include any semiconductor material. For example, the material of the semiconductor substrate 10 may include, but not limited to, Si, SOI, strained Si, SSOI, SiGe, Ge, III-V, metal oxide semiconductor, polysilicon, and the like.

According to the present invention, the bandgap (i.e. the second bandgap) of the barrier layer is larger than the bandgap (i.e. the first bandgap) of the channel layer. As mentioned above, the term "bandgap" represents the energy difference between the top of the valence band (i.e. Ev) and the bottom of the conduction band (i.e. Ec). Typically, the barrier layer comprises III-V compound semiconductors having a bandgap about 0.5 to about 10 times of the bandgap of the III-V compound semiconductor materials used for the channel layer. More typically, the barrier layer comprises III-V compound semiconductors having a bandgap about 1 to about 5 times of the bandgap of the III-V compound semiconductor materials used for the channel layer.

Since materials of wide bandgap are used for the barrier layer and materials of narrow bandgap are used for the channel layer, in a certain gate bias range, the carriers are limited within the channel layer. Typically, when a typical gate bias condition is applied, the carriers are limited within the channel layer.

In a preferred embodiment of the present invention, the barrier layer comprises an InAlAs alloy, while the channel layer comprises an InGaAs alloy. "InAlAs alloy" represents the composition of $In_xAl_{1-x}As$ alloy, wherein x is from about 0 to about 1, and more preferably, from about 0.4 to about 0.6. In a preferred embodiment of the present invention, x is 0.52. "InGaAs alloy" represents the composition of $In_yGa_{1-y}As$ alloy, wherein y is from about 0 to about 1, and more preferably, from about 0.3 to about 0.8. In a preferred embodiment of the present invention, y is 0.7.

The III-V compound semiconductor layers of the present invention are preferably formed by an epitaxial growth process, for example molecular beam epitaxial growth (MBE) or Metal Organic Chemical Vapor Deposition (MOCVD). That is to say, each of the III-V compound semiconductor layers is formed by an epitaxial growth process that generates high quality monocrystalline III-V films. Each of the III-V compound semiconductor layers of the present invention can be deposited in the same or different apparatus.

A drain region 22 and a source region 24 are located respectively on the sides of the channel region on the semiconductor substrate 10. The drain region 22 may, for example, be formed by n+ Si, and the source region 24 may, for example, be formed by p+ strained germanium. A gate dielectric layer 30 is formed on the channel region, and a gate conductor layer 32 is formed on the gate dielectric layer 30. The material of the gate dielectric layer 30 may include high K (dielectric constant) or low K material, such as $SiO_2$, $ZrO_2$, $HfO_2$, $Al_2O_3$, HfSiO, HfSiON and/or a mixture thereof. The gate dielectric layer may be formed by a thermal growth process, such as oxidizing, nitridizing or oxynitriding. Alternatively, the gate dielectric layer may be formed by a deposition process, such as Chemical Vapor Deposition (CVD), plasma assisted CVD, Atomic Layer Deposition (ALD), vapor plating, reactive sputtering, chemical solution deposition or other similar deposition processes, and the gate dielectric layer may also be formed by a combination of any of the above-mentioned processes. The gate conductor layer 32 may include a conductive material of any type, which includes, but is not limited to, polysilicon, metal or metal alloy, silicide, conductive nitride, polycrystalline silicon-germanium or a combination thereof. Contact electrodes 38 are formed according to conventional processes on the gate conductor layer as well as the source and drain.

A tunneling barrier structure 26 is provided between the channel region and the source region. The tunneling barrier structure may, for example, be a structure of highly doped PN junction, NP junction, PNP junction or NPN junction, or a structure of heavily doped heterogeneous energy band PN junction, NP junction, PNP junction or NPN junction, or a quantum well structure. Preferably, the overlapping direction of the barrier structure is parallel to the conducting direction of the channel.

The semiconductor device according to the present invention makes use of the quantum tunneling mechanism and breaks the limit of thermokinetics; the narrow band material increases the tunneling efficiency and the channel transmission speed; the design of alternating energy bands of heterogeneous source-channel junction increases the tunneling efficiency; the heterogeneous drain-channel junction reduces the reverse current leakage; the channel quantum well and the tunneling junction barrier provide an information storage function of a single-transistor; meanwhile, various substrate structures and double-gate or multiple-gate three-dimensional channel structures can be applied.

Now, the manufacturing process of the semiconductor device according to a first embodiment of the present invention will be described with reference to FIGS. 2-9.

Figure 1A:
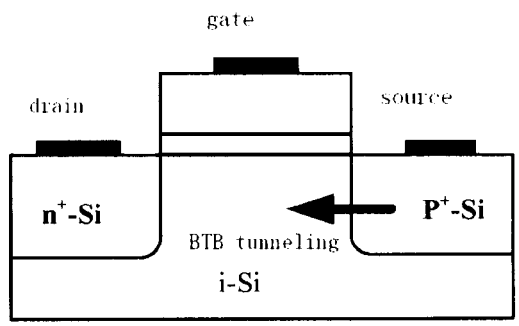
FIG. 1 shows several typical existing tunneling transistors.
Figure 1B:
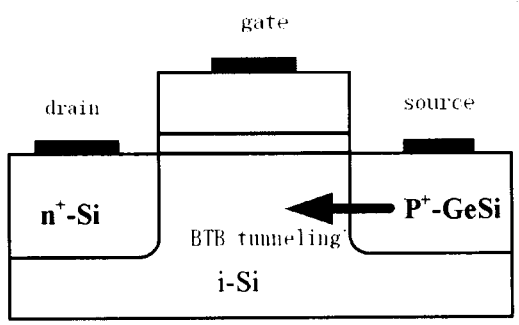
Figure 1C:
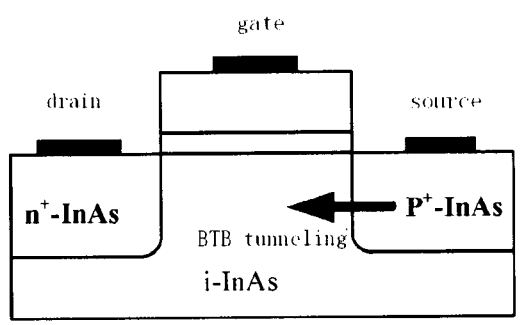
Figure 1D:
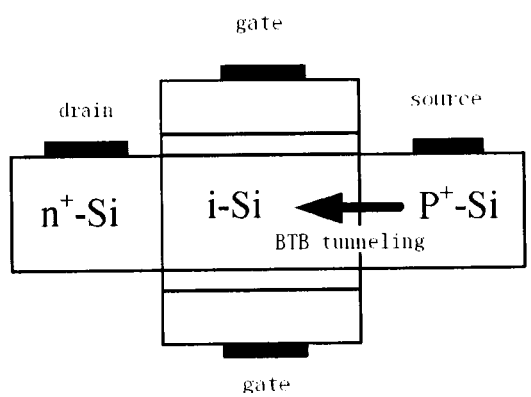
Figure 2:
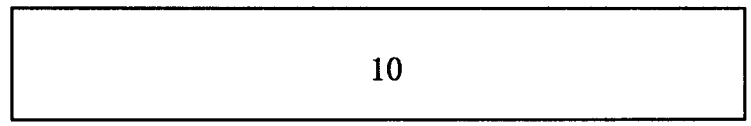
FIGS. 2-9 show the manufacturing process of the semiconductor device according to the embodiment of the present invention.

First, as shown in FIG. 2, a semiconductor substrate 10 is provided. The material of the semiconductor substrate 10 may include, but not limited to, Si, SOI, strained Si, SSOI, SiGe, Ge, III-V, metal oxide semiconductor and polysilicon.

Figure 3:
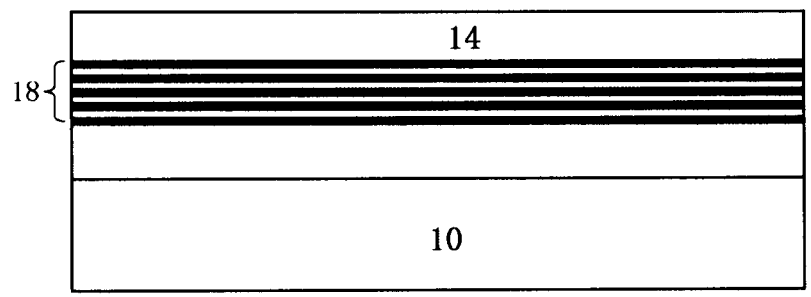

Next, as shown in FIG. 3, a semiconductor region 14 comprising a quantum well structure 18 is formed on the semiconductor substrate 10 (the semiconductor region finally forms a channel region through the processes that will be described below). The quantum well structure 18 may include strained Si/GeSi, Ge/GeSi, strained Ge/III-V compound semiconductor materials, GaN/AlGaN, InGaAs/InAlAs, InGaAs/AlGaAs, InAs/AlSb, InSb/AlInSb, or InGaAs/InP. One example of the quantum well structure 18 is a multi-layered quantum well structure of III-V compound semiconductors. The multi-layered quantum well structure of III-V compound semiconductors may, for example, include an alternating structure of a III-V compound semiconductor channel layer having a first bandgap and a III-V compound semiconductor barrier layer having a second bandgap.

Figure 4:
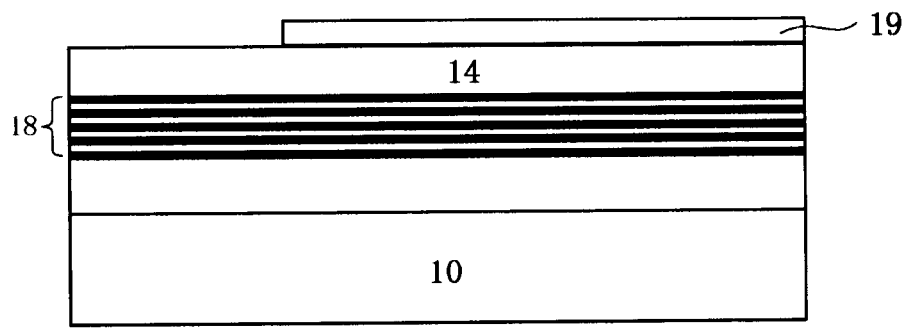

Then, a mask layer (first mask layer) made of, for example, silicon dioxide, is formed on the semiconductor region 14, and the mask layer is patterned through a photolithography process to expose the drain formation region, as shown in FIG. 4. Now, other portions of the semiconductor region 14 are still covered by the mask layer. Numeral 19 in FIG. 4 denotes the patterned mask layer.

Figure 5:
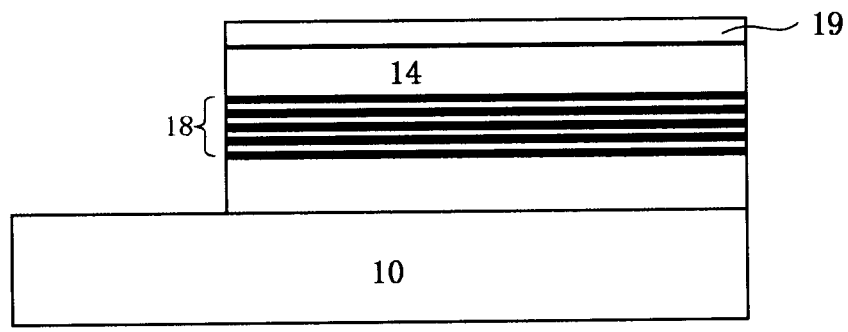

Then as shown in FIG. 5, the semiconductor material in the drain formation region is removed by an etching process (dry etching or wet etching) to expose the semiconductor substrate 10.

Figure 6:
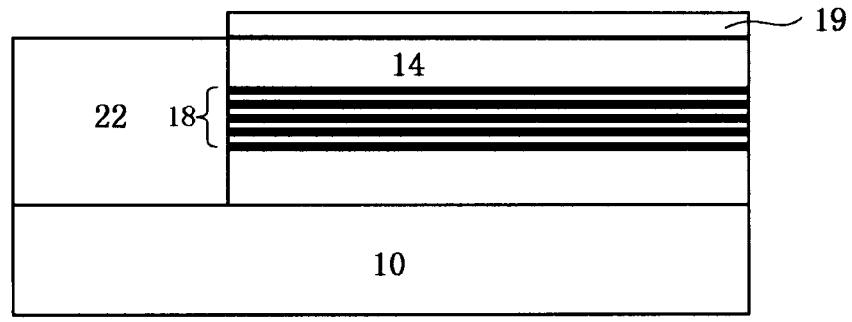

Next, as shown in FIG. 6, a semiconductor material, such as Si, for forming the drain region 22 is grown through a selective epitaxy in the drain formation region. Of course, the material of the drain region is not limited to Si, but it may also be Si, Ge, strained Ge, GeSi, GaAs, InP, InGaAs, AlGaAs, InAlAs, InAs, AlSb, InSb, AlInSb, GaN or AlGaN, for example. During the selective epitaxy, the semiconductor material for the drain region is deposited on the exposed semiconductor substrate surface, meanwhile, no deposition occurs on the surface of the mask layer, such as silicon dioxide. Namely, the growth of the semiconductor material for the drain region is selective to the surface of the mask layer. Subsequently, the mask layer is removed.

Figure 7:
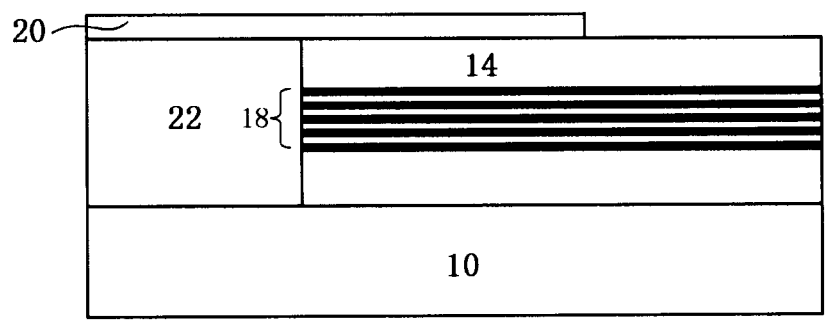

Afterwards, a second mask layer, such as silicon dioxide, is formed as shown in FIG. 7. The mask layer is patterned through a lithography process to expose the source formation region. Numeral 20 in FIG. 7 represents the patterned second mask layer.

Figure 8:
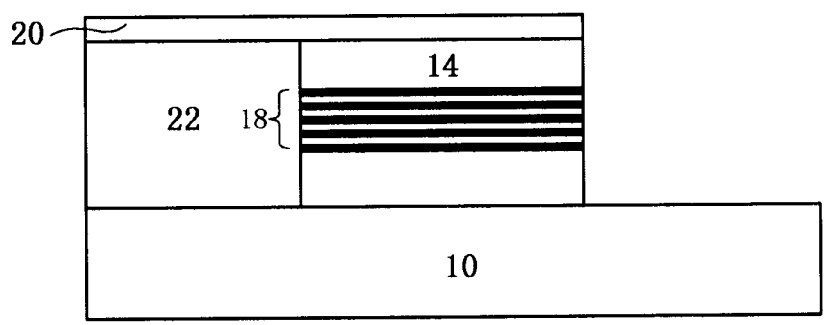

Then, as shown in FIG. 8, the semiconductor material in the drain formation region is removed using an etching process (dry etching or wet etching) to expose the semiconductor substrate. The remaining semiconductor region 14 after the etching forms the channel region.

Figure 9:
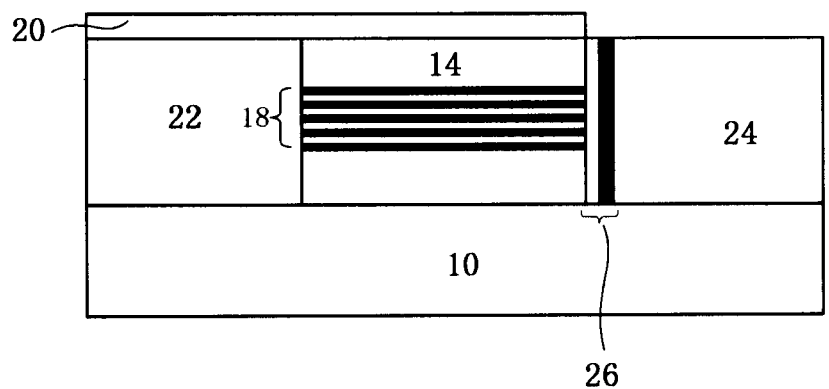

Next, as shown in FIG. 9, the tunneling bather structure 26 is formed on the sidewall of the channel region, which is, for example, perpendicular to the semiconductor substrate surface. The tunneling barrier may, for example, be a structure of highly doped PN junction, NP junction, PNP junction or NPN junction, or a structure of heavily doped heterogeneous energy band PN junction, NP junction, PNP junction or NPN junction, or a quantum well structure. In one example, the tunneling bather structure comprises such a heterogeneous junction as AlGaAs and GaAs.

Then, a semiconductor material, such as strained germanium, for generating the source region 24 is grown through a selective epitaxy in the source formation region. The material of the source region is not limited to strained germanium, but it may also be Si, Ge, GeSi, GaAs, InP, InGaAs, AlGaAs, InAlAs, InAs, AlSb, InSb, AlInSb, GaN or AlGaN, for example.

During the selective epitaxy, the semiconductor material of the source region is deposited on the exposed semiconductor substrate surface, meanwhile, no deposition occurs on the surface of the mask layer, such as silicon dioxide. Namely, the growth of the semiconductor material of the source region is selective to the surface of the mask layer. Subsequently, the second mask layer is removed.

According to the present invention, an ion doping operation (i.e. in situ doping) may be performed directly during growing the source/drain semiconductor material. For example, a reactant containing a doping ion component is doped into the reactants for generating the source/drain semiconductor material; alternatively, the ion doping operation may be performed through an ion implantation process after generation the source/drain semiconductor material.

The in situ doping has the following advantage: the dopant introduced into the source/drain semiconductor material is incorporated into the substituent position of the crystal lattice structure during the in situ doping, so there is no longer the need for activating and annealing the dopant, and accordingly, the thermal diffusion of the dopant is minimized Afterwards, a gate dielectric layer 30 is formed on the channel region, and a gate conductor layer 32 is formed on the gate dielectric layer 30. The material of the gate dielectric layer 30 may include a high K (dielectric constant) or low K material, such as $SiO_2$, $ZrO_2$, $HfO_2$, $Al_2O_3$, HfSiO, HfSiON and/or a mixture thereof. The gate dielectric layer may be formed by a thermal growth process, such as oxidizing, nitridizing or oxynitriding. Alternatively, the gate dielectric layer may be formed by a deposition process, such as Chemical Vapor Deposition (CVD), plasma assisted CVD, Atomic Layer Deposition (ALD), vapor plating, reactive sputtering, chemical solution deposition or other similar deposition processes, and the gate dielectric layer may also be formed by a combination of any of the above-mentioned processes.

The gate conductor layer 32 may include a conductive material of any type, which includes, but is not limited to, polysilicon, metal or metal alloy, silicide, conductive nitride, polycrystalline silicon-germanium or a combination thereof.

Finally, contact electrodes 38 are formed according to conventional processes on the gate conductor layer as well as the source/drain regions.

It shall be understood that the above are examples of the semiconductor device and the manufacturing method thereof according to the present invention, but the present invention is not limited to the descriptions of the specific embodiments given above. The semiconductor device according to the present invention has the following advantages:

ultralow working voltage, the device working voltage may be smaller than 0.5V (owing to the high tunneling efficiency, high channel mobility, reduced current leakage in the heterogeneous drain-channel junction, and so on, the value of SS is reduced and the channel current leakage is prevented);

ultrahigh sub-threshold current-voltage slope, SS may be smaller than 40 mV/dec (because that the source-channel quantum barrier increases the tunneling efficiency, the quantum tunneling conduction breaks the limit of thermokinetics, the narrow band material reduces the effective mass of the carrier, etc.);

the drive current exceeding that of a conventional silicon-based MOS device (because of high tunneling efficiency, high channel mobility, the narrow band material reducing the effective mass of the carrier, etc.)

information storage function of a low voltage single-transistor (the quantum tunneling effect increases the amount of electrical charges implanted into the channel region to increase the threshold change sensitivity of a single-transistor; the multi-layered quantum well structure influences the channel carrier distribution so as to influence the source region tunneling efficiency, thereby increasing the threshold change sensitivity of a single-transistor; the barrier height of the quantum tunneling junction of the source region can be modulated to control the tunneling efficiency to increase the threshold change sensitivity of a single-transistor);

low reverse current leakage, weak bipolar current-voltage characteristic (source-channel quantum barrier increases the tunneling efficiency, the drain-channel junction reduces current leakage, and so on).

In addition, the scope to which the present invention is applied is not limited to the process, mechanism, manufacture, material composition, means, methods and steps described in the specific embodiments in the specification. Those skilled in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the teaching of the present invention without departing from the protection scope thereof.

What is claimed is:

1. A semiconductor device, comprising:
   a semiconductor substrate;
   a channel region on the semiconductor substrate, said channel region including a quantum well structure;
   a source region and a drain region on the sides of the channel region;
   a gate structure on the channel region; and
   a tunneling barrier structure between the source region and the channel region;
   wherein the materials for the channel region, the source region and the drain region have different energy bands, and
   wherein bandgap of the material of the source region is smaller than that of the material of the channel region, and bandgap of the material of the channel region is smaller than that of the material of the drain region.

2. The semiconductor device according to claim 1, wherein electric charges tunnel from the source region into the channel region through the barrier and are conducted to the drain region with high speed by means of the quantum well structure in the channel region so as to form electric current.

3. The semiconductor device according to claim 1, wherein the semiconductor device is used as a logic switch and information storage function of a single-transistor is realized through modulation of the tunneling barrier and the quantum well structure.

4. The semiconductor device according to claim 1, wherein the substrate is an insulator, a semi-insulator or a semiconductor.

5. The semiconductor device according to claim 1, wherein the gate structure is single gate structure, a double-gate structure or a multiple-gate structure.

6. The semiconductor device according to claim 1, wherein the semiconductor device is a planar device or a vertical device.

7. The semiconductor device according to claim 1, wherein the material of the drain region is Si, strained Si, Ge, strained Ge, GeSi, GaAs, InP, InGaAs, AlGaAs, InAlAs, InAs, AlSb, InSb, AlInSb, GaN or AlGaN.

8. The semiconductor device according to claim 7, wherein the quantum well structure in the channel region comprises strained Si/GeSi, Ge/GeSi, strained Ge/III-V compound semiconductor material, GaN/AlGaN, InGaAs/InAlAs, InGaAs/AlGaAs, InAs/AlSb, InSb/AlInSb, or InGaAs/InP.

9. The semiconductor device according to claim 8, wherein the material of the source region is Si, strained Si, Ge, strained Ge, GeSi, GaAs, InP, InGaAs, AlGaAs, InAlAs, InAs, AlSb, InSb, AlInSb, GaN or AlGaN.

10. The semiconductor device according to claim 1, wherein the tunneling barrier structure is a structure of highly doped PN junction, NP junction, PNP junction or NPN junction, or a structure of heavily doped heterogeneous energy band PN junction, NP junction, PNP junction or NPN junction, or a quantum well structure.

11. The semiconductor device according to claim 10, wherein the overlapping direction of the barrier structure is parallel to the direction of the channel current.

12. A semiconductor device manufacturing method, comprising:
    providing a semiconductor substrate;
    forming a semiconductor layer comprising a quantum well structure on the semiconductor substrate;
    forming a first mask layer on the semiconductor layer;
    patterning the mask layer to expose a drain formation region;
    removing the semiconductor layer in the drain formation region;
    forming a semiconductor material for a drain region;
    forming a second mask layer and patterning the second mask layer to expose a source formation region;
    removing the semiconductor layer in the source formation region;
    forming a tunneling bather structure on the sidewall of the exposed semiconductor layer;
    forming a semiconductor material for a source region,
    wherein the semiconductor layer between the source region and the drain region forms a channel region,
    wherein the materials of the channel region, the source region and the drain region have different energy bands, and
    wherein bandgap of the material of the source region is smaller than that of the material of the channel region, and bandgap of the material of the channel region is smaller than that of the material of the drain region.

13. The method according to claim 12, wherein electrical charges tunnel from the source region into the channel region through the barrier and are conducted to the drain region with high speed by means of the quantum well structure in the channel region so as to form electrical current.

14. The method according to claim 12, wherein the semiconductor device is used as a logic switch, and information storage function of a single-transistor is realized through modulation of the tunneling barrier and the quantum well structure.

15. The method according to claim 12, wherein the tunneling barrier structure is a structure of highly doped PN junction, NP junction, PNP junction or NPN junction, or a structure of heavily doped heterogeneous energy band PN junction, NP junction, PNP junction or NPN junction, or a quantum well structure.

16. The method according to claim 12, wherein the substrate is an insulator, a semi-insulator or a semiconductor.

17. The method according to claim 12, wherein the gate structure is single gate structure, a double-gate structure or a multiple-gate structure.

18. The method according to claim 12, wherein the semiconductor device is a planar device or a vertical device.

19. The method according to claim 12, wherein the material of the drain region is Si, strained Si, Ge, strained Ge, GeSi, GaAs, InP, InGaAs, AlGaAs, InAlAs, InAs, AlSb, InSb, AlInSb, GaN or AlGaN.

20. The method according to claim 19, wherein the quantum well structure in the channel region comprises strained Si/GeSi, Ge/GeSi, strained Ge/III-V compound semiconductor material, GaN/AlGaN, InGaAs/InAlAs, InGaAs/AlGaAs, InAs/AlSb, InSb/AlInSb, or InGaAs/InP.

21. The method according to claim 20, wherein the material of the source region is one of Si, strained Si, Ge, strained Ge, GeSi, GaAs, InP, InGaAs, AlGaAs, InAlAs, InAs, AlSb, InSb, AlInSb, GaN or AlGaN.

* * * * *